(12) United States Patent
Wang et al.

(10) Patent No.: US 8,885,359 B2
(45) Date of Patent: Nov. 11, 2014

(54) GUIDE BRACKET AND ELECTRONIC DEVICE ADOPTING THE GUIDE BRACKET

(71) Applicant: Hangzhou H3C Technologies Co., Ltd, Zhejang (CN)

(72) Inventors: Xiaojun Wang, Beijing (CN); Yongfeng Tang, Beijing (CN)

(73) Assignee: Hangzhou H3C Technologies Co., Ltd., Zhejiang (CN)

( * ) Notice: Subject to any disclaimer, the term of this patent is extended or adjusted under 35 U.S.C. 154(b) by 0 days.

(21) Appl. No.: 14/348,573

(22) PCT Filed: Nov. 26, 2012

(86) PCT No.: PCT/CN2012/085236
§ 371 (c)(1),
(2), (4) Date: Mar. 28, 2014

(87) PCT Pub. No.: WO2013/078971
PCT Pub. Date: Jun. 6, 2013

(65) Prior Publication Data
US 2014/0285991 A1    Sep. 25, 2014

(30) Foreign Application Priority Data
Nov. 29, 2011    (CN) .......................... 2011 1 0388842

(51) Int. Cl.
*H05K 7/02*    (2006.01)
*H05K 7/14*    (2006.01)

(52) U.S. Cl.
CPC .................................. *H05K 7/1461* (2013.01)
USPC .............. 361/807; 49/425; 248/201; 312/221

(58) Field of Classification Search
USPC .............. 361/807; 49/425; 312/221; 248/201
See application file for complete search history.

(56) References Cited

U.S. PATENT DOCUMENTS

| | | | |
|---|---|---|---|
| 5,673,516 A * | 10/1997 | Hughes et al. ................. | 49/425 |
| 6,714,406 B2 | 3/2004 | Chen et al. | |
| 2005/0179346 A1 * | 8/2005 | Ludwig et al. ................ | 312/221 |
| 2011/0174939 A1 * | 7/2011 | Taylor .......................... | 248/201 |

FOREIGN PATENT DOCUMENTS

CN    200990046    12/2007
(Continued)

OTHER PUBLICATIONS

Written Opinion dated Feb. 28, 2013 issued on PCT Patent Application No. PCT/CN2012/085236 filed on Nov. 26, 2012, The State Intellectual Property Office, the P.R. China.
International Search Report and Written Opinion dated Feb. 28, 2013 issued on PCT Patent Application No. PCT/CN2012/085236 filed on Nov. 26, 2012, The State Intellectual Property Office, the P.R. China.

(Continued)

*Primary Examiner* — Xiaoliang Chen

(57) ABSTRACT

According to an example, a guide bracket and an electronic device adopting the guide bracket are provided. A free end of a resilient sheet installed in a wall of the guide bracket is to be held by a snap-fit part set in a chassis beyond the external surface of the wall where the resilient sheet is located to implement position limiting of the guide bracket in the forward-backward direction. The free end of the resilient sheet is to retreat inwards with the bending of the resilient sheet towards the interior of the wall where the resilient sheet is located to avoid the snap-fit part.

11 Claims, 7 Drawing Sheets

(56) References Cited

FOREIGN PATENT DOCUMENTS

| | | |
|---|---|---|
| CN | 201069544 | 6/2008 |
| CN | 101719005 | 6/2010 |
| CN | 101754633 | 6/2010 |
| CN | 101866201 | 10/2010 |
| CN | 201622514 | 11/2010 |
| CN | 102427693 | 4/2012 |
| WO | WO2010138824 | 12/2010 |

OTHER PUBLICATIONS

CN First Office Action dated Jan. 6, 2014, CN Patent Application No. 201110388842.5 dated Nov. 29, 2011, State Intellectual Property Office, P.R. China.

CN Second Office Action dated Apr. 16, 2014, CN Patent Application No. 201110388842.5 dated Nov. 29, 2011, State Intellectual Property Office, P.R. China.

* cited by examiner

GUIDE BRACKET AND ELECTRONIC DEVICE ADOPTING THE GUIDE BRACKET

CLAIM FOR PRIORITY

The present application is a national stage filing under 35 U.S.C 371 of PCT application number PCT/CN2012/085236, having an international filing date of Nov. 26, 2012, which claims priority of China application number 201110388842.5 having a filing date of Nov. 29, 2011, the disclosure of which is hereby incorporated by reference in its entirety.

BACKGROUND

At present, various electronic devices are equipped with plug-in cards providing different functions. A plug-in card installed in a chassis of an electronic device adds additional functions to the electronic device. Since there are various types of plug-in cards with different sizes, different layouts are needed for a chassis to accommodate the different widths of plug-in cards having different sizes.

When two plug-in cards with 1 unit width need to be fitted in a row into an area with 1 unit (1 U) height between two adjacent upper and lower partition plates in a chassis, a guide bracket should be installed between the two plug-in cards to provide a slide. Thus, each plug-in card can be inserted or pulled out along a slide on one side formed on the internal surface of a side plate of the chassis and another slide on the other side provided by the guide bracket.

BRIEF DESCRIPTION OF THE DRAWINGS

Features of the present disclosure are illustrated by way of example and not limited in the following figure(s), in which like numerals indicate like elements, in which.

DETAILED DESCRIPTION

Figure 1:
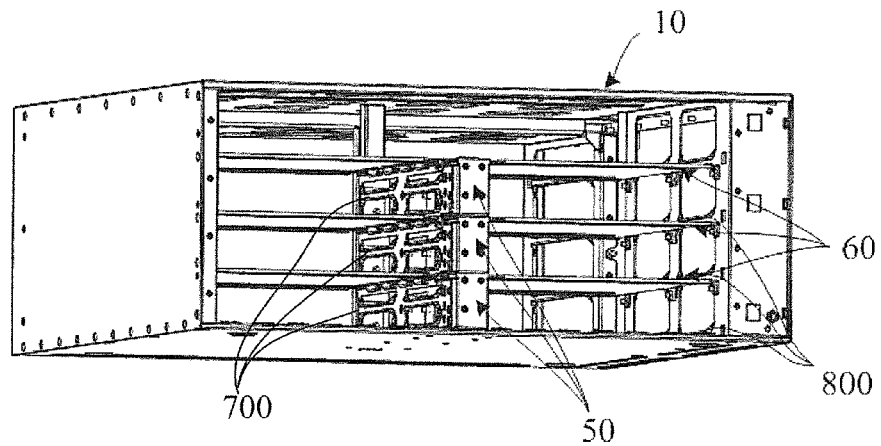
FIG. 1 is an assembly diagram illustrating removable guide brackets and partition plates above and below the guide brackets in a chassis of an electronic device according to an example of the present disclosure.

For simplicity and illustrative purposes, the present disclosure is described by referring mainly to an example thereof. In the following description, numerous specific details are set forth in order to provide a thorough understanding of the present disclosure. It will be readily apparent however, that the present disclosure may be practiced without limitation to these specific details. In other instances, some methods and structures have not been described in detail so as not to unnecessarily obscure the present disclosure. As used herein, the term "includes" means includes but not limited to, the term "including" means including but not limited to. The term "based on" means based at least in part on. In addition, the terms "a" and "an" are intended to denote at least one of a particular element.

Reference will now be made in detail as to the description of the disclosure as illustrated in the drawings. While the disclosure will be described in connection with these drawings, there is no intent to limit it to the features disclosed therein. On the contrary, the intent is to cover all alternatives, modifications and equivalents included within the spirit and scope of the disclosure as defined by the appended claims.

The present disclosure describes several examples given below. It is understood, however, that the examples below are not necessarily limitations to the present disclosure, but are used as typical implementations of the disclosure. It will be appreciated from the description provided herein that a variety of alternative examples and implementations may be realized, consistent with the scope and spirit of the present disclosure.

In conventional layouts, plug-in cards to be set in a chassis of an electronic device may have different widths. The space with 1 unit (1 U) height between two adjacent upper and lower partition plates in a chassis may accommodate two plug-in cards, each of which having a width of 1 width unit (the size of 1 width unit may be defined according to the size of the chassis), arranged in a row. The space with 1 U height between two adjacent upper and lower partition plates in a chassis may alternatively accommodate one plug-in card having a width of 2 width units. A slide may be installed in a chassis for facilitating insertion and removal of a plug-in card. In order to change the layout of a chassis easily, a guide bracket providing slides is required to be removable. Currently, there is a need of a cheap and easy-to-remove guide bracket.

An example provides an electronic device which may include: a chassis which has two side plates. The two side plates have slides formed on their internal surfaces facing each other. The electronic device may further include: partition plates installed between the two side plates in the chassis and vertically spaced with each other, and a guide bracket installed between two adjacent upper and lower partition plates.

The guide bracket may include a guide body which has two walls and a bottom. The two walls have slides formed on their external surfaces.

A partition plate includes a partition plate body. The lower surface of the partition plate body has a snap-fit part on its fore edge at a position beyond the external surface of each wall of the guide bracket.

Each wall of the guide bracket has a resilient sheet installed at a position near the front of the guide body. The resilient sheet has a fixed end and a free end. The fixed end is fixed on the internal surface of the wall where the resilient sheet is installed; the free end is located at the upper edge of the wall and bends over the upper edge to extend beyond the external surface of the wall, and is operable to fit into the snap-fit part in the partition plate above the guide bracket at a position beyond the external surface of the wall where the resilient sheet locates after the guide bracket is inserted between two adjacent upper and lower partition plates in the chassis. The free end is also to retreat to a position to avoid the snap-fit part corresponding to the free end when the resilient sheet elastically bends towards the interior of the wall where the resilient sheet is installed.

A button may be fixed on the resilient sheet installed on each wall of the guide bracket. Each wall may have a hole at a position near the front of the guide body. The button may stick out of the wall where the resilient sheet is installed through the hole in the wall, for receiving an external force which makes the resilient sheet bend towards the interior of the wall where the resilient sheet is installed.

FIG. 1 is an assembly diagram illustrating removable guide brackets and partition plates above and below the guide brackets in a chassis of an electronic device according to an example. As shown in FIG. 1, the electronic device may include a chassis 10 which has two side plates. The two side plates have slides 800 formed on their internal surfaces facing each other. Partition plates 60 are set between the two side plates in the chassis 10, and are uniformly and vertically spaced. A guide bracket 50 is set in an area having 1 U height between two adjacent upper and lower partition plates 60, and is set at a position between two plug-in cards arranged in a row.

As shown in FIG. 1, guide brackets 50 provide slides 700. The slides 700 provided by the guide brackets 50 cooperate with slides 800 provided by the two side plates of the chassis 10 to enable insertion of a plug-in card. In addition, the guide brackets 50 and the partition plates 60 may work together to limit the position of the guide brackets 50 in the space between the partition plates 60 in the forward-backward direction and in the left-right direction.

The structures for limiting the position of the guide bracket 50 in the forward-backward direction and in the left-right direction are different from those for conventional guide brackets. Accordingly, the structure of the partition plate 60 working with the guide bracket 50 is also different from that of conventional partition plates. The following is a detailed description of the structure of the guide bracket 50 and the partition plate 60.

Basic structures of the guide bracket 50 and the partition plate 60 are firstly introduced.

Figure 2A:
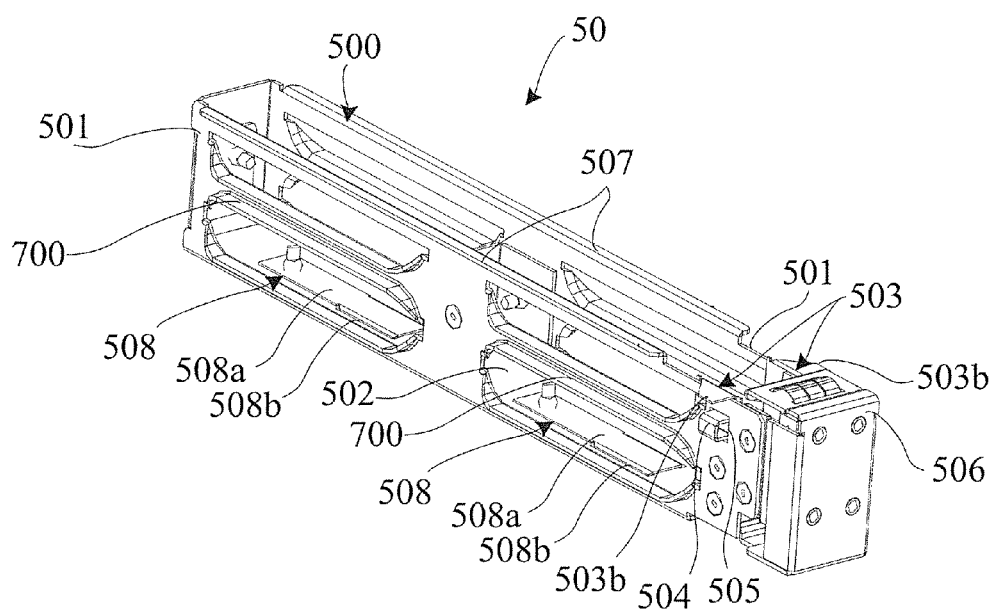
FIGS. 2a to 2b are schematic diagrams illustrating a guide bracket shown in FIG. 1 viewed from different directions, according to examples of the present disclosure.
Figure 2B:
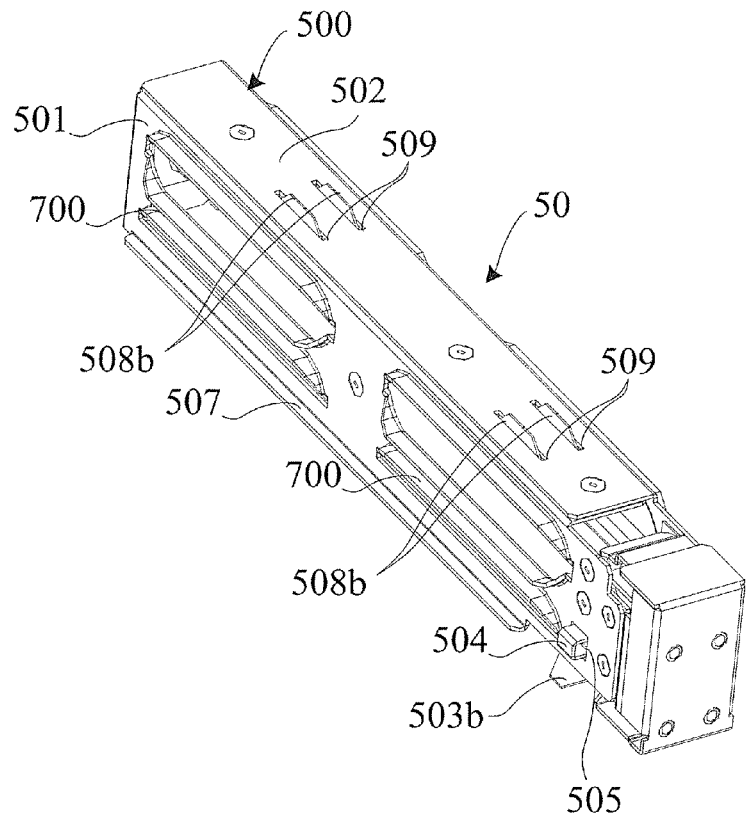
Figure 3A:
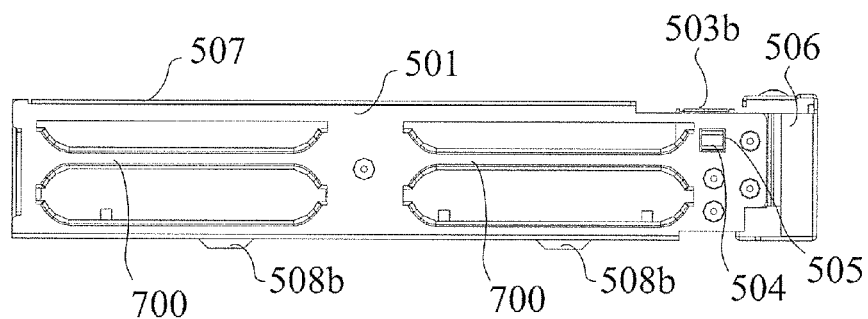
FIGS. 3a to 3e are schematic diagrams illustrating projective views of a guide bracket shown in FIG. 1 from different directions, according to examples of the present disclosure.
Figure 3B:
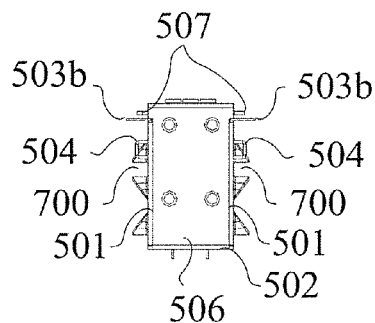
Figure 3C:
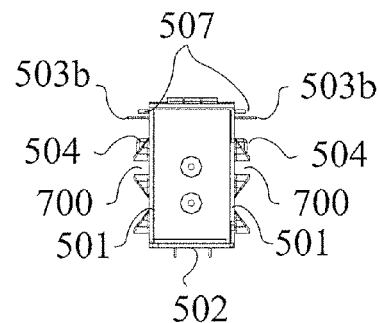
Figure 3D:
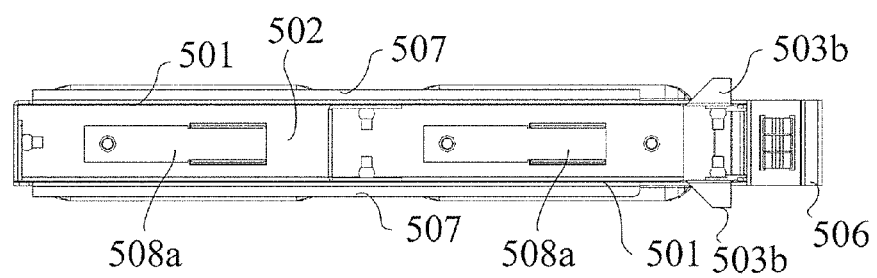
Figure 3E:
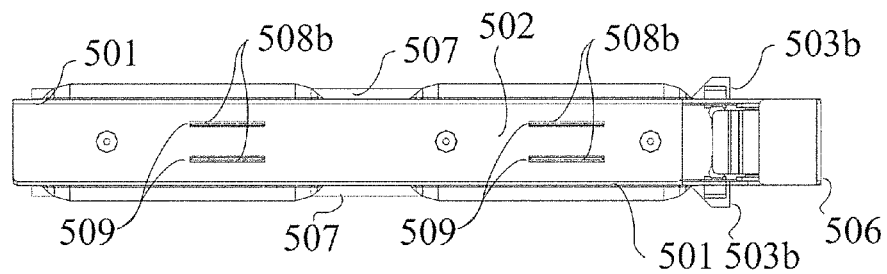
Figure 4:
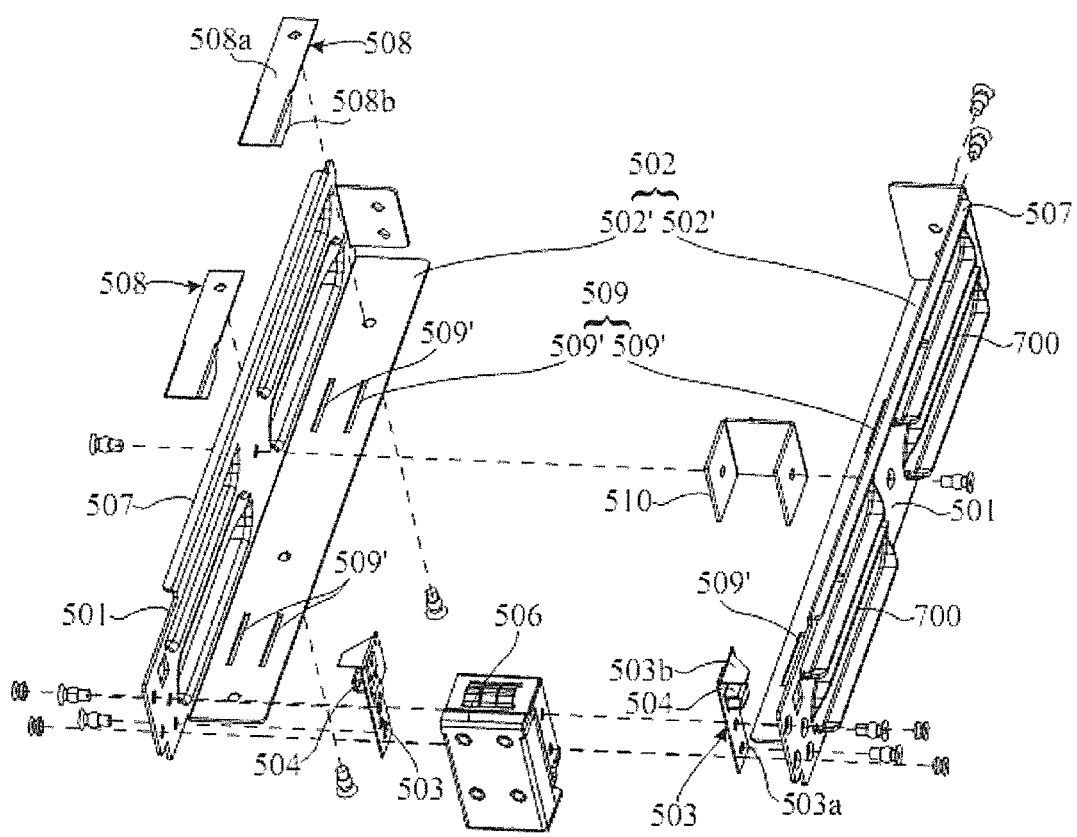
FIG. 4 is a schematic diagram illustrating a disassembled structure of a guide bracket shown in FIG. 1, according to an example of the present disclosure.

FIGS. 2a to 2b are schematic diagrams illustrating a guide bracket shown in FIG. 1 viewed from different directions. FIGS. 3a to 3e are schematic diagrams illustrating projective views of the guide bracket shown in FIG. 1 from different directions. FIG. 4 is a schematic diagram illustrating a disassembled structure of a guide bracket shown in FIG. 1. FIG. 2a is a schematic diagram illustrating a guide bracket viewed from above the guide bracket. FIG. 2b is a schematic diagram illustrating a guide bracket viewed from below the guide bracket. FIG. 3a is a projective view of a guide bracket from a side of the guide bracket. FIG. 3b is a projective view of a guide bracket in the head-to-rear direction. FIG. 3c is a projective view of a guide bracket in the rear-to-head direction. FIG. 3d is a projective view of a guide bracket in the top-to-bottom direction. FIG. 3e is a projective view of a guide bracket in the bottom-to-top direction.

As shown in FIGS. 2a to 2b, 3a to 3e, and 4, a guide bracket 50 of an example may include a guide body having two walls 501 and a bottom 502. The two walls have slides 700 formed on their external surfaces.

In an example, the lower edge of each wall 501 has an extending part 502' extending towards the other wall 501. Extending parts 502' of the two walls 501 may overlap to form the bottom 502, i.e. the guide body 500 is composed of two parts. In other examples, the guide body 500 may also be produced to be jointless as a unibody.

In this example, the guide bracket 50 is made of sheet metal, therefore the following installation and fixing may be implemented by commonly adopted connecting measures for sheet metal such as rivets, and the like. In other examples, when the guide bracket 50 is made of non-metal materials, the installing and fixing may adopt other measures.

In an example, a panel 506 may be installed between the internal surfaces of the two walls 501 at a position close to the front of the guide body 500.

In an example, a bearing part 510 may be installed between the internal surfaces of the two walls 501 at a position between the front and the rear end of the guide body 500 to increase the robustness of the guide body 500 of the guide bracket 50. In another example, the slide 700 formed on an external surface of the wall 501 may have an opening between the front and the rear end of the guide body 500, and the bearing part 510 may be set at the position of the opening of the slide 700. The slide 700 may adopt other structures, and the bearing part 510 may be located at other positions correspondingly.

Figure 5:
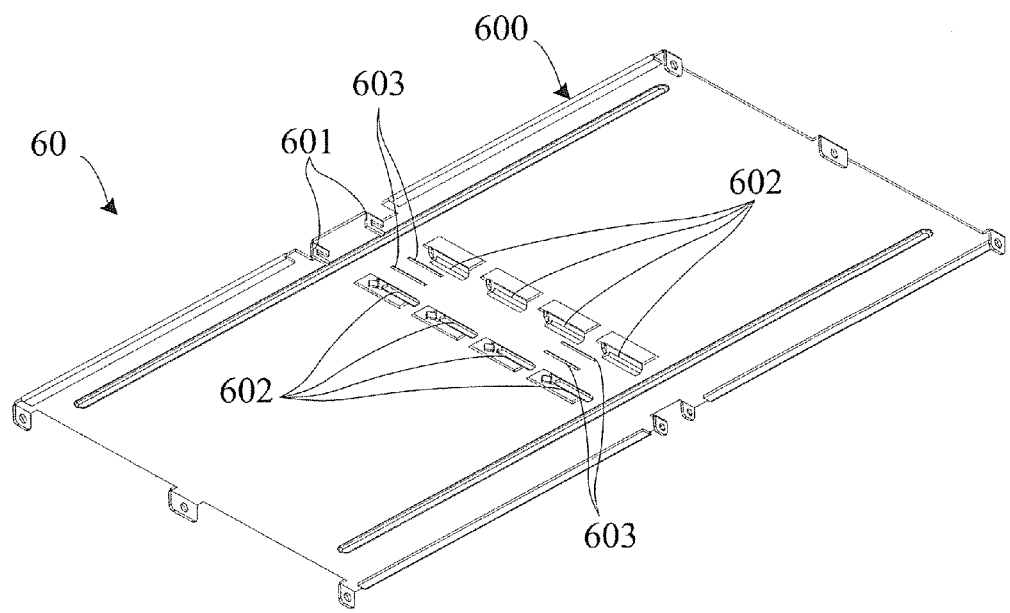
FIG. 5 is a schematic diagram illustrating a partition plate shown in FIG. 1, according to an example of the present disclosure.

FIG. 5 is a schematic diagram illustrating a partition plate shown in FIG. 1.

As shown in FIG. 4, the partition plate 60 of an example may include a partition plate body 600. The partition plates 60 are generally installed from upper to lower in a chassis to divide the space in the chassis into several portions each with 1 U height for accommodating a guide bracket 50. That is, there may be a guide bracket 50 on each side of a partition plate 60. Therefore, the partition plate body 600 may provide different structures for guide brackets 50 above and below the partition plate body 600.

Figure 6:
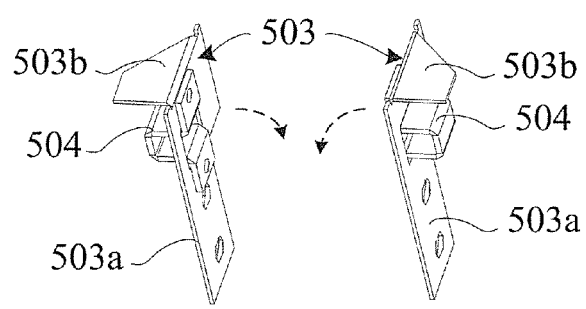
FIG. 6 is an assembly diagram illustrating resilient sheets and buttons in a guide bracket shown in FIGS. 2a to 2b, 3a to 3e and 4, according to an example of the present disclosure.
Figure 7:
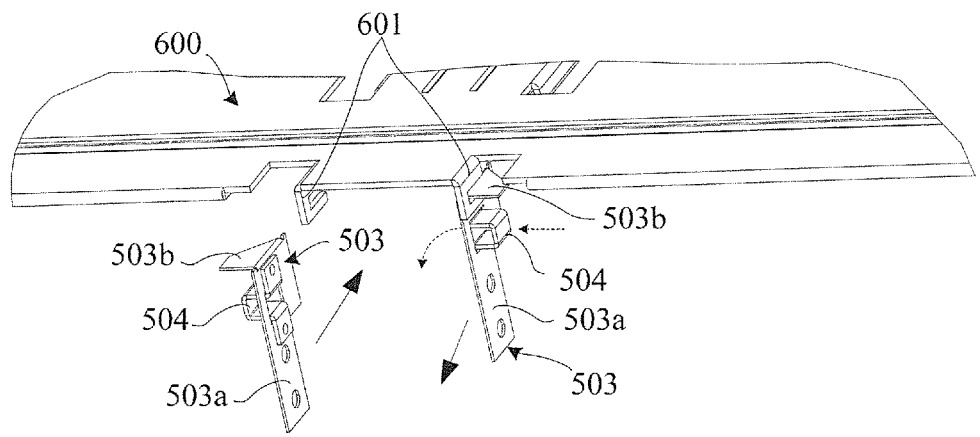
FIG. 7 is a schematic diagram illustrating resilient sheets and buttons of a guide bracket shown in FIGS. 2a to 2b, 3a to 3e and 4 working with a partition plate above the guide bracket shown in FIG. 5, according to an example of the present disclosure.

The following describes the structure provided by the guide bracket 50 and the partition plate 60 for limiting the position of the guide bracket 50 in the forward-backward direction Referring to FIGS. 6 and 7 in combination with FIGS. 2a to 2b, FIGS. 3a to 3e, and FIG. 4, the guide bracket 50 may further include a hole 505 in a wall 501, a resilient sheet 503, and a button 504 for limiting the position of the guide bracket 50 in the forward-backward direction. FIG. 6 is an assembly diagram illustrating resilient sheets and buttons in a guide bracket shown in FIGS. 2a to 2b, 3a to 3e, and 4; FIG. 7 is a schematic diagram illustrating resilient sheets and buttons of a guide bracket shown in FIGS. 2a to 2b, 3a to 3e, and 4 working with a partition plate above the guide bracket shown in FIG. 5.

A resilient sheet 503 is set at each wall 501. The resilient sheet 503 has a fixed end 503a and a free end 503b. The fixed end 503a is fixed on the internal surface of the wall 501 where the resilient sheet 503 is located. The free end 503b is located at the upper edge of the wall 501 where the resilient sheet 503 is located, and bends and extends beyond the external surface of the wall 501 where the resilient sheet 503 is located. The free end 503b is to be held by the snap-fit part in the partition plate above the guide bracket from an exterior of the wall where the resilient sheet becomes located after the guide bracket is inserted between two adjacent upper and lower partition plates in the chassis. The free end is also to retreat to a position to avoid the snap-fit part corresponding to the free end when the resilient sheet elastically bends towards the wall where the resilient sheet is installed.

A button 504 may be fixed on the resilient sheet 503 installed on each wall 501 of the guide bracket. Each wall 501 may have a hole at a position of the button 504. The button 504 may stick out of the wall 501 where the resilient sheet is located through the hole on the wall 501, for receiving an external force which makes the resilient sheet bend towards the interior of the wall where the resilient sheet is located.

Referring to FIG. 7 and FIG. 5, a structure may be set on the partition plate 60 above the guide bracket 50 for limiting the position of the guide bracket 50 in the forward-backward structure.

The lower surface of the partition plate body 600 of the partition plate 60 may have a snap-fit part 601 on its fore edge at a position beyond the external surface of each wall 501 of the guide bracket 50. The snap-fit part 601 is to lock the free end 503b of the resilient sheet 503 of the guide bracket 50 below the partition plate 60 to hold the free end 503b of the resilient sheet 503 of the guide bracket 50 below the partition plate 60 in the forward-backward direction.

In this example, the snap-fit part 601 on the fore edge of the lower surface of the baffle 60 may be a snap-fit hook whose opening is towards the back edge of the partition plate 60. In other examples, the snap-fit part 601 may have other shapes.

During the process of inserting the guide bracket 50 into two upper and lower partition plates 60, the above structure set on the guide bracket 50 and the partition plate 60 implements the following functions. The rear end of the guide body 500 of the guide bracket 50 faces the space with a height of 1 U between the two adjacent upper and lower baffle brackets 60, and the guide bracket 50 begins to move into the space. Since the snap-fit part 601 of the partition plate 60 above the guide bracket 50 is in the way of the free end 503b of the resilient sheet 503 moving together with the guide bracket 50, it is necessary to make the resilient sheet 503 of the guide bracket 50 bend towards the interior of the wall 501 so that the free end 503b of the resilient sheet 503 may retreat inward with the bending of the resilient sheet 503 to avoid the snap-fit part 601 from blocking the installation of the guide bracket 50, and the track of the free end 503b of the resilient sheet 503 of the guide bracket 50 is illustrated by the dotted single-arrow curve as shown in FIG. 6. When the guide bracket 50 is inserted wholly into the space with a height of 1 U between the two adjacent upper and lower partition plates 60, the free end 503b, which bends inwards with the resilient sheet 503, moves around to the side of the snap-fit part 601. Then the resilient sheet 503 returns to the normal state that the resilient sheet was in before the bending, so that the free end 503b of the resilient sheet 503 is held by the snap-fit part 601 on the corresponding side of the partition plate 60 above the guide bracket 50 at a position beyond the external surface of the wall 501 on which the resilient sheet 503 is installed. Thus, movements of the guide bracket 50 in the forward-backward direction are restricted to implement the position limiting of the guide bracket 50 in the forward-backward direction.

During the removing process of pulling the guide bracket 50 out from the two upper and lower partition plates 60, the above structure set on the guide bracket 50 and the partition plate 60 implements the following functions. Firstly, the resilient sheet 503 of the guide bracket 50 is bent elastically towards the interior of the wall 501 on which the resilient sheet 503 is installed to make the free end 503b of the resilient sheet 503 retreat inwards with the elastic bending of the resilient sheet 503 to avoid the snap-fit part 601 and to further escape the snap-fit part 601, and the track of the retreating movement of the free end 503b of the resilient sheet 503 of the guide bracket 50 is illustrated by the dotted single-arrow curve as shown in FIG. 6. Then, the guide bracket 50 is taken out from the space between the two adjacent upper and lower partition plates 60. When the resilient sheet 503 of the guide bracket 50 moves outside of the space between the two adjacent upper and lower partition plates 60, the resilient sheet 503 may be released to recover the normal state that the resilient sheet was in before the bending.

In view of the foregoing, when the guide bracket 50 is inserted into the space between the two adjacent upper and lower partition plates 60 in the chassis 10, the snap-fit joint of the free end 503b of the resilient sheet 503 of the guide bracket 50 with the snap-fit part 601 of the partition plate 60 above the guide bracket 50 limits the position of the guide bracket 50 in the forward-backward direction. Further, the guide bracket 50 can be easily installed and removed by making the resilient sheet 503 of the guide bracket 50 bend elastically towards the interior of wall 501 on which the resilient sheet 503 is located to avoid the contact of the free end 503b with the snap-fit part 601.

Thus the described configuration with the resilient sheet restricts movement of the guide bracket in the forward and backward direction. However, pressing the button deforms the resilient sheet such that it may easily be moved during installation or removal from the chassis. This configuration is relatively cheap and simple to manufacture and may not require precision tooling.

In addition, since the button 504 of the guide bracket 50 sticks out of the external surface of the wall 501 on which the resilient sheet 503 is located through the hole 505 on the wall 501, the button 504 may receive the external force making the resilient sheet 503 elastically bend towards the interior of the wall 501 to make the free end 503b retreat with the bending of the resilient sheet 503 towards the interior of the wall 501 to avoid the snap-fit part 601. When the external force is relaxed, the resilient sheet 503 may return to the normal state. That is, during the process of installing or removing the guide bracket 50, the button 504 may be used in forcing the resilient sheet 503 to elastically bend towards the interior of the wall 501 on which the resilient sheet 503 is located.

Another example provides another structure for the free end 503b of the resilient sheet 503, which eliminates the need of using the button 504 to make the resilient sheet 503 elastically bend towards the interior of the wall 501 during the installation process of the guide bracket 50.

According to the example, a side of the free end 503b of the resilient sheet 503 that faces the rear end of the guide body 500 sticks out of the external surface of the wall 501 on which the resilient sheet 503 is located and tilts to the front of the guide body 500. The side of the free end 503b is to bear the blocking force of the snap-fit part towards the front of the guide body to make the resilient sheet elastically bend towards the interior of the wall on which the resilient sheet is located when the guide bracket is being inserted into the chassis. That is, the front of the guide body has a shape similar to a rear fin of an aircraft so that the side of the free end 503b that faces the rear end of the guide body 500 may touch the snap-fit part 601 of the partition plate 60 above the guide bracket 50 when moving into the space between the two adjacent upper and lower partition plates with the guide bracket 50, be blocked by the snap-fit part 601, and generate a force forcing the resilient sheet 503 to elastically bend towards the interior of the wall 501 on which the resilient sheet 503 is located. Therefore, the resilient sheet 503 is able to be forced to elastically bend towards the interior of the wall 501 without the need of an external force applied onto the button 504.

It means that if the side of the free end 503b of the resilient sheet 503 that faces the rear end of the guide body 500 tilts in the above manner, the guide bracket 50 may be installed without the need of pressing the button 504, and the button 504 needs to be pressed only during the removing process of the guide bracket 50. Therefore, the installation of the guide bracket 50 becomes much easier.

The following describes an example where the position of the guide bracket 50 in the left-right direction is further restricted by the guide bracket 50 and the partition plate 60.

Figure 8:
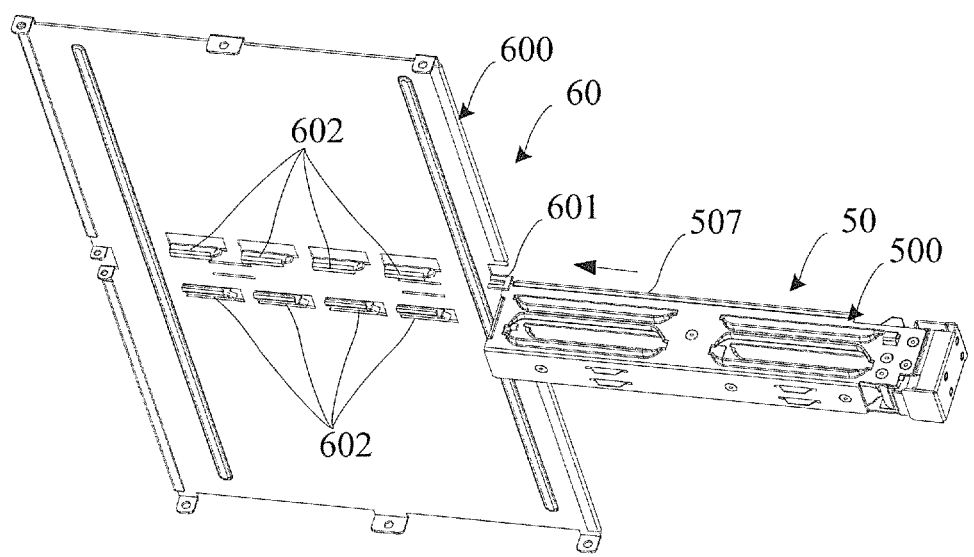
FIG. 8 is a schematic diagram illustrating a guide bracket shown in FIGS. 2a to 2b, 3a to 3e and 4 working with a partition plate above the guide bracket shown in FIG. 5, according to an example of the present disclosure.
Figure 9:
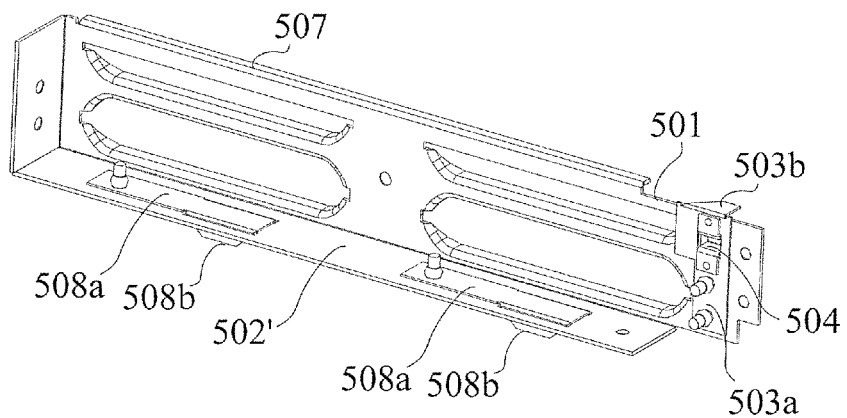
FIG. 9 is an assembly diagram illustrating a bottom panel and limiters of a guide bracket shown in FIGS. 2a to 2b, 3a to 3e and 4, according to an example of the present disclosure.
Figure 10:
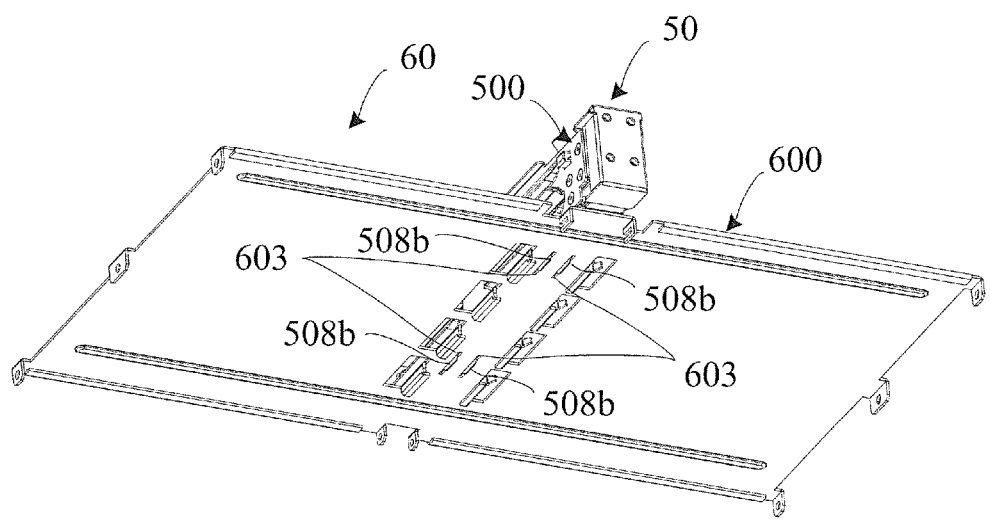
FIG. 10 is a schematic diagram illustrating a guide bracket shown in FIGS. 2a to 2b, 3a to 3e and 4 working with a partition plate below the guide bracket shown in FIG. 5, according to an example of the present disclosure.

Referring to FIGS. 8 to 10 in combination of FIGS. 2a to 2b, 3a to 3e and 4, the guide bracket 50 may further include a flange 507 on the wall 501, a position-limiting plate 508 set on the bottom 502 and a slot 509 in the bottom 502 for limiting the position of the guide bracket 50 in the left-right direction. FIG. 8 is a schematic diagram illustrating a guide bracket shown in FIGS. 2a to 2b, 3a to 3e and 4 working with a partition plate above the guide bracket shown in FIG. 5. FIG. 9 is an assembly diagram illustrating a bottom panel and limiters of a guide bracket shown in FIGS. 2a to 2b, 3a to 3e and 4. FIG. 10 is a schematic diagram illustrating a guide bracket shown in FIGS. 2a to 2b, 3a to 3e and 4 working with a partition plate below the guide bracket shown in FIG. 5.

The upper edge of each wall 501 of the guide bracket 50 may further have a flange 507 on the external surface of the wall. The flange 507 is to fit in a position-limiting rail in the partition plate above the guide bracket in the chassis after the guide bracket is inserted between the two adjacent upper and lower partition plates in the chassis. The length of part of the flange 507 that sticks out of the external surface of the wall 501 is smaller than the length of the sticking-out part of the free end 503 of the resilient sheet 503 to avoid the snap-fit part 601 of the partition plate 60 above the guide bracket 50 thus to avoid contact with the snap-fit part 601 of the baffle part 60 above the guide bracket 50 during the installation process of the guide bracket 50.

A position-limiting plate 508 may be set at the bottom of the guide body 500 of the guide bracket 50. The position-limiting plate 508 has a fixed body 508a and a position-limiting end 508b. The fixed body 508a is fixed at the bottom 502. The position-limiting plate 508b is connected to the fixed body 508a, and sticks out of the external surface of the bottom 502 through a slot 509 in the bottom 502 of the guide body 500. The position-limiting plate 508b is to dip into the position-limiting groove of the partition plate below the guide bracket after the guide bracket is inserted between the two adjacent upper and lower partition plates in the chassis.

It should be noted that in the example where the guide body 500 is made up of two parts, the extending part 502' of the lower edge of each wall 501 extending towards the other wall 501 may have a part 509' of the slot 509 in it. When the extending parts 502' of the two walls 501 overlap with each other, the parts 509' of the slot 509 in the extending parts 502' of the two walls 501 overlay with each other to form the slot 509, and thus the bottom 502 with the slot 509 is formed by the two parts of the guide body 500 put together. When the guide body 500 is produced as a jointless guide body, the slot 509 may be directly cut out of the bottom 502.

Referring to FIGS. 8 to 10 in combination with FIG. 5, a structure is set on the partition plates 60 above and below the guide bracket 50 for limiting the position of the guide bracket 50 in the left-right direction.

The lower surface of the partition plate body 600 of the partition plate 60 above the guide bracket 50 may have a position-limiting track 602 at the position corresponding to the external surface of each wall 501 of the guide bracket 50, and the distance between two position-limiting tracks 602 may be smaller than the distance between two snap-fit parts 601. The position-limiting track 602 may accommodate the flange 507 of the guide bracket 50 below the partition plate 60, enable the flange 507 to pass through the two snap-fit parts 601 and to slide within it, and block the flange 507 on the upper edge of the wall 501 of the guide bracket 50 below the partition plate in the left-right direction.

The partition plate body 600 of the partition plate 60 below the guide bracket 50 may have a position-limiting track 603 at a position between the two walls 501 of the guide bracket 50. The position-limiting track 603 may accommodate the position-limiting end 508b of the position-limiting plate 508 of the guide bracket 50 above the partition plate 60 to block the position-limiting end 508b of the position-limiting plate 508 on the bottom of the guide bracket 50 above the partition plate in the left-right direction.

It can be seen that both the top and the bottom of the guide bracket 50 may suffer position-limiting in the left-right direction, thus the position-limiting in the left-right direction of the guide bracket 50 is much steadier than that of conventional guide brackets.

In another example, the number of the position-limiting ends of the position-limiting plates of a guide bracket is the same as the number of the slots in the bottom of the guide bracket and with the number of position-limiting grooves in the partition plates, e.g. two or multiple. Not all of the at least two position-limiting ends of the position-limiting plates of a guide bracket, the slots in the bottom of the guide bracket, and the position-limiting grooves in the partition plates are aligned in the extending direction of the guide body.

For example, there may be two position-limiting plates 508. Each of the position-limiting plates 508 may have two position-limiting ends 508b, i.e., there are a total of four position-limiting ends 508b. The number of slots in the bottom 502 equals the number of the position-limiting ends 508b, i.e., four. Each position-limiting end 508 is aligned with a slot 509 corresponding to the position-limiting end 508 in the extending direction of the guide body 500.

Accordingly, the number of the position-limiting grooves 603 in the partition plate body 600 of the partition plate 60 is four, and each two position-limiting grooves 603 are aligned with each other in the extending direction of the guide body 500.

When the number of the position-limiting ends 508b, the number of the slots 509, and the number of position-limiting grooves 603 are set to be the same and to be at least two, similar effects with situations with four position-limiting ends 508b may also be achieved as long as the at least two position-limiting ends 508b and the slots 509 are not aligned with each other in the extending direction of the guide body 500.

Therefore, the free end of an resilient sheet set on each wall of the guide bracket may be held by the snap-fit part set in the chassis at a position beyond the external surface of the wall 501 on which the resilient sheet is installed, thus the drawbacks resulting from the usage of the long screw in conventional devices for position limiting in the forward-backward direction may be avoided. The free end of the resilient sheet may retreat inwards along with the bending of the resilient sheet towards the interior of the wall on which the resilient sheet is located to avoid the snap-fit part. The resilient sheet may have a button for receiving an external force making the resilient sheet elastically bent to make the free end of the resilient sheet to limit the position in the forward-backward direction and not hamper the installation and removal of the guide bracket.

In an example, a side of the free end of an resilient sheet that faces the rear end of the guide body 500 may stick out of the external surface of the wall 501 on which the resilient sheet is located and tilts to the front of the guide body 500, and makes the resilient sheet elastically bend when being blocked by the snap-fit part, without having to relying on an external force being applied on the button.

According to an example, a wall of a guide bracket may have a flange on its upper edge and a position-limiting plate on its bottom. The positions of the flange and the position-limiting plate in the chassis are limited in the left-right direction by a position-limiting track and a position-limiting groove respectively, thus the position of the guide bracket is restricted in the left-right direction respectively at the positions of the upper edge and the bottom of the wall. The position limiting in the left-right direction at the position of the upper edge of the wall is implemented by a flange on the upper edge of the wall that is to slide within a position-limiting track according to examples. The position limiting is much steadier than that implemented by the contact between the upper edge and a drawing bridge in conventional devices.

What has been described and illustrated herein is an example of the disclosure along with some of its variations. The terms, descriptions and figures used herein are set forth by way of illustration only and are not meant as limitations. Many variations are possible within the spirit and scope of the disclosure, which is intended to be defined by the following claims—and their equivalents—in which all terms are meant in their broadest reasonable sense unless otherwise indicated.

The invention claimed is:

1. A guide bracket, comprising:
   a guide body having two walls and a bottom, wherein slides are formed on external surfaces of the two walls;
   a resilient sheet installed on each of the two walls at a position near a front of the guide body; wherein the resilient sheet has a fixed end and a free end, the fixed end is fixed on an internal surface of the wall on which the resilient sheet is installed, the free end is located at an upper edge of the wall on which the resilient sheet is installed and bends over the upper edge to extend beyond an external surface of the wall, and the resilient sheet is to be held by a snap-fit part set in a chassis at a position beyond the external surface of the wall after the guide bracket is inserted into the chassis, and to retreat to a position to avoid the snap-fit part when the resilient sheet elastically bends towards the interior of the wall on which the resilient sheet is installed;
   a button fixed on the resilient sheet installed on each of the two walls; each wall having a hole at a position near the front of the guide body, wherein the button is to stick out of the wall where the resilient sheet is installed through the hole on the wall and to receive an external force which makes the resilient sheet bend towards the interior of the wall where the resilient sheet is installed.

2. The guide bracket of claim 1, wherein a side of the free end of the resilient sheet that faces a rear end of the guide body tilts to the front of the guide body in a direction extending out of the external surface of the wall on which the resilient sheet is located to make the resilient sheet elastically bend towards the interior of the wall when pressed by a blocking force of the snap-fit part towards the front of the guide body when the guide bracket is being inserted into the chassis.

3. The guide bracket of claim 1, wherein
   an external surface of an upper edge of each wall further comprises a flange to be held in a position-limiting tract in the chassis when the guide bracket is inserted into the chassis, wherein the length of the flange sticking out of the external surface of the wall is smaller than the length of the free end of the resilient sheet sticking out of the external surface of the wall to avoid contact with the snap-fit part; and
   the bottom of the guide body has a position-limiting plate and a slot, wherein the position-limiting plate has a fixed end and a position-limiting end, the fixed end is fixed on the bottom, the position-limiting end is connected to the fixed end, and the position-limiting end sticks out of an external surface of the bottom through the slot in the bottom to be inserted into a position-limiting groove set in the chassis when the guide bracket is inserted into the chassis.

4. The guide bracket of claim 3, wherein the position-limiting plate comprises a number of position-limiting ends that equals a number of slots in the bottom and is at least two and all of the at least two position-limiting ends and the slots in the bottom are not aligned with each other in a direction in which the guide body extends.

5. The guide bracket of claim 1, further comprising:
   a bearing part between internal surfaces of the two walls that face each other at a position between the front and the rear end of the guide body.

6. An electronic device, comprising:
   a chassis having two side plates, wherein the two side plates have slides formed on their internal surfaces facing each other;
   partition plates vertically spaced between the two side plates in the chassis;
   a guide bracket installed between two adjacent upper and lower partition plates;
   wherein the guide bracket comprises a guide body which has two walls and a bottom, and the two walls have slides formed on their external surfaces;
   wherein each of the partition plates comprises a partition plate body and wherein a lower surface of the partition plate body has a snap-fit part on the fore edge of the lower surface at a position beyond an external surface of each wall of the guide bracket;
   wherein a resilient sheet is installed on each wall of the guide bracket at a position near a front of the guide body; wherein the resilient sheet comprises a fixed end and a free end, the fixed end is fixed on an internal surface of the wall where the resilient sheet is installed, the free end is located at an upper edge of the wall and bends over the upper edge to extend beyond the external surface of the wall, and wherein the free end is to be held by a snap-fit part of a partition plate above the guide bracket at a position beyond the external surface of the wall after the guide bracket is inserted between the two adjacent upper and lower partition plates in the chassis, and is to retreat to a position to avoid the snap-fit part when the resilient sheet elastically bends towards the interior of the wall;
   wherein a button is fixed on the resilient sheet installed on each wall of the guide body, a hole is formed in each wall at a position near a front of the guide body, and the button is to stick out of the wall where the resilient sheet is installed through the hole on the wall, and wherein the button is to receive an external force that makes the resilient sheet bend towards the interior of the wall where the resilient sheet is installed.

7. The electronic device of claim 6, wherein a side of the free end of the resilient sheet that faces a rear end of the guide body tilts to the front of the guide body in a direction extending out of the external surface of the wall on which the resilient sheet is located to make the resilient sheet elastically bend towards the interior of the wall when pressed by a blocking force of the snap-fit part towards the front of the guide body when the guide bracket is being inserted into the chassis.

8. The electronic device of claim 6, wherein
a lower surface of the partition plate body of a partition plate further comprises a position-limiting track at a position corresponding to an external surface of each wall of the guide bracket; the partition plate body of the partition plate further comprising a position-limiting groove at a position between the two walls of the guide brackets;
an external surface of an upper edge of each wall further comprises a flange to be held in a position-limiting track in a partition plate above the guide bracket when the guide bracket is inserted between two adjacent upper and lower partition plates in the chassis, wherein the length of the flange sticking out of the external surface of the wall is smaller than the length of the free end of the resilient sheet sticking out of the external surface of the wall to avoid contact with the snap-fit part; and
the bottom of the guide body of the guide bracket has a position-limiting plate and a slot; the position-limiting plate has a fixed end and a position-limiting end, wherein the fixed end is fixed on the bottom, the position-limiting end is connected to the fixed end, sticks out of an external surface of the bottom through the slot in the bottom and is to be inserted into a position-limiting groove in a partition plate below the guide bracket when the guide bracket is inserted between the two adjacent upper and lower partition plates in the chassis.

9. The electronic device of claim 8, wherein the position-limiting plate comprises a number of position-limiting ends that is the same as the number of the slots in the bottom of the guide bracket and with the number of position-limiting grooves in the partition plates and is at least two, and wherein all of the at least two position-limiting ends of the position-limiting plates of a guide bracket, the slots in the bottom of the guide bracket, and the position-limiting grooves in the partition plates are not aligned in a direction in which the guide body extends.

10. The electronic device of claim 6, further comprising: a bearing part between internal surfaces of the two walls that face each other at a position between the front and the rear end of the guide body.

11. The electronic device of claim 6, wherein the snap-fit part on the upper edge of the lower surface of the partition plate is a snap-fit hook whose opening is towards a back edge of the partition plate.

* * * * *